United States Patent [19]
Baliga

[11] Patent Number: 6,023,078
[45] Date of Patent: Feb. 8, 2000

[54] BIDIRECTIONAL SILICON CARBIDE POWER DEVICES HAVING VOLTAGE SUPPORTING REGIONS THEREIN FOR PROVIDING IMPROVED BLOCKING VOLTAGE CAPABILITY

[75] Inventor: Bantval Jayant Baliga, Raleigh, N.C.

[73] Assignee: North Carolina State University, Raleigh, N.C.

[21] Appl. No.: 09/067,664

[22] Filed: Apr. 28, 1998

[51] Int. Cl.$^7$ .................. H01L 29/749; H01L 31/0256
[52] U.S. Cl. .................. 257/122; 257/124; 257/129; 257/141; 257/162; 257/343; 257/409; 257/492
[58] Field of Search .................. 257/122, 124, 257/129, 141, 162, 409, 343, 492

[56] References Cited

U.S. PATENT DOCUMENTS

| | | | |
|---|---|---|---|
| 4,199,774 | 4/1980 | Plummer | 357/41 |
| 4,742,380 | 5/1988 | Chang | 257/122 |
| 5,233,215 | 8/1993 | Baliga | 257/490 |
| 5,241,194 | 8/1993 | Baliga | 257/133 |
| 5,323,040 | 6/1994 | Baliga | 257/332 |
| 5,382,828 | 1/1995 | Neudeck et al. | 257/586 |
| 5,396,087 | 3/1995 | Baliga | 257/139 |
| 5,399,883 | 3/1995 | Baliga | 257/77 |
| 5,449,925 | 9/1995 | Baliga et al. | 257/77 |
| 5,459,089 | 10/1995 | Baliga | 437/40 |
| 5,493,134 | 2/1996 | Mehrotra et al. | 257/132 |
| 5,543,637 | 8/1996 | Baliga | 257/77 |
| 5,569,937 | 10/1996 | Bhatnagar | 257/492 |
| 5,585,650 | 12/1996 | Kumagai | 257/124 |
| 5,608,235 | 3/1997 | Pezzani | 257/119 |
| 5,635,412 | 6/1997 | Baliga et al. | 438/520 |
| 5,681,762 | 10/1997 | Baliga | 437/22 |
| 5,883,413 | 3/1999 | Ludiknuize | 257/492 |

FOREIGN PATENT DOCUMENTS 404094572A  3/1992  Japan .

OTHER PUBLICATIONS

B. Jayant Baliga, Breakdown Voltage, Chapter 3, Power Semiconductor Devices, 1996, PWS Publishing Company, pp. 66–127.

International Search Report, PCT/US99/08740, Aug. 20, 1999.

*Primary Examiner*—Jerome Jackson, Jr.
*Attorney, Agent, or Firm*—Myers Bigel Sibley & Sajovec

[57] ABSTRACT

Silicon carbide power devices include a semiconductor substrate of first conductivity type (e.g., N-type) having a face thereon and a blocking voltage supporting region of first conductivity type therein extending to the face. The voltage supporting region is designed to have a much lower majority carrier conductivity than an underlying and highly conductive "bypass" portion of the semiconductor substrate. This bypass portion of the substrate supports large lateral currents with low on-state voltage drop. First and second semiconductor devices are also provided having respective first and second active regions of first conductivity type therein. These first and second active regions extend on opposing sides of the voltage supporting region and are electrically coupled to the bypass portion of the semiconductor substrate which underlies and extends opposite the voltage supporting region relative to the face of the substrate. These first and second semiconductor devices are configured to provide bidirectional I–V characteristics by facilitating conduction in the first and third quadrants. A plurality of spaced regions of lower conductivity than the voltage supporting region are also formed in the voltage supporting region and extend to the face. These plurality of spaced regions extend opposite the bypass portion of the substrate and enhance the blocking voltage capability of the voltage supporting region.

20 Claims, 1 Drawing Sheet

6,023,078

BIDIRECTIONAL SILICON CARBIDE POWER DEVICES HAVING VOLTAGE SUPPORTING REGIONS THEREIN FOR PROVIDING IMPROVED BLOCKING VOLTAGE CAPABILITY

FIELD OF THE INVENTION

The present invention relates to semiconductor devices for high power applications and more particularly to silicon carbide semiconductor devices for high power applications.

BACKGROUND OF THE INVENTION

Thyristors are commonly used for high current and high voltage applications in motor drive circuits, appliance controls, robotics, lighting ballasts, solid-state relays, power inversion in high-voltage transmission lines and in other high power applications. This is because thyristors exhibit bistable characteristics and can be switched between a high-impedance, low-current OFF state and a low-impedance, high-current ON state. Thyristors are now available with current ratings from a few milliamperes to over 5000A and voltage ratings extending above 10,000 V. Triode AC switches (TRIACs) are also extensively used for high power switching applications because they are inexpensive to manufacture and offer thyristor-like characteristics in two directions and have ON and OFF states for both positive and negative anode voltages. Unfortunately, TRIACs typically require a moderate amount of gate current to trigger conduction in both first and third quadrant modes of operation. TRIACs also typically do not exhibit current saturation at high voltages or gate-controlled turn-off capability. Instead, TRIACs are typically turned off by reversing the anode potential. These features of TRIACs typically result in power devices having reduced forward-biased safe-operating-area (FBSOA) and reduced reverse-biased safe-operating-area (RBSOA). Moreover, because the rate at which TRIACs may be turned on typically cannot be carefully regulated, significant electromagnetic interference (EMI) may be encountered when such devices are used for consumer applications. The on-state voltage drop of a typical TRIAC may also be relatively large (on the order of about 1 V or higher) and such voltage drops can lead to significant power losses during high on-state forward conduction.

To address these limitations associated with conventional TRIACs, preferred bidirectional AC switching devices have been proposed. Such devices are described in U.S. Pat. No. 5,493,134 to Mehrotra et al. entitled "Bidirectional AC Switching Device With Mos-Gated Turn-On and Turn-Off Control", assigned to the present assignee, the disclosure of which is hereby incorporated herein by reference. Notwithstanding these preferred bidirectional devices, improved power semiconductor devices having carefully controllable turn-on and turn-off characteristics are still required.

SUMMARY OF THE INVENTION

It is therefore an object of the present invention to provide improved silicon carbide semiconductor devices.

It is another object of the present invention to provide silicon carbide semiconductor devices having low on-state voltage drop.

It is a further object of the present invention to provide silicon carbide semiconductor devices having high and bidirectional current carrying capability.

It is still a further object of the present invention to provide silicon carbide semiconductor devices having high and bidirectional blocking voltage capability.

It is yet another object of the present invention to provide lateral silicon carbide semiconductor devices having MOS-gate control.

These and other objects, advantages and features of the present invention are provided by semiconductor switching devices which have symmetric bidirectional current carrying and voltage blocking characteristics. According to the present invention, preferred switching devices contain a semiconductor substrate of first conductivity type (e.g., N-type) having a face thereon and a blocking voltage supporting region of first conductivity type therein extending to the face. The voltage supporting region is designed to have a much lower majority carrier conductivity than an underlying and highly conductive "bypass" portion of the semiconductor substrate. This bypass portion of the substrate supports large lateral currents with low on-state voltage drop. A composite semiconductor device is also preferably provided at the face of the semiconductor substrate, as a lateral semiconductor switching device. Preferably, the composite semiconductor device comprises first and second unit cell semiconductor devices which have respective first and second active regions of first conductivity type therein. These first and second active regions extend on opposing sides of the voltage supporting region and are electrically coupled to the bypass portion of the semiconductor substrate which underlies and extends opposite the voltage supporting region relative to the face of the substrate. These first and second semiconductor devices are preferably configured to provide bidirectional I–V characteristics by facilitating conduction in the first and third quadrants. According to one aspect of the present invention, a plurality of spaced regions of lower conductivity than the voltage supporting region are formed in the voltage supporting region (which separates the first and second active regions) and extend to the face. These plurality of spaced regions extend opposite the bypass portion of the substrate and enhance the blocking voltage capability of the voltage supporting region.

In a preferred embodiment of the present invention, the plurality of spaced regions of lower conductivity comprise amorphous regions having ions therein which are electrically inactive in the voltage supporting region. Here, the plurality of amorphous regions each have a conductivity which is less than about 0.01 times a conductivity of the voltage supporting region and the voltage supporting region has a conductivity which is less than about 0.01 times a conductivity of the bypass region. In addition, the semiconductor regions which make up the preferred switching device comprise silicon carbide and the electrically inactive ions preferably include silicon, carbon, argon and neon. The first and second unit cell semiconductor devices also preferably comprise silicon carbide accumulation-mode field effect transistors (ACCUFETs) which, in a lateral embodiment, utilize buried regions of second conductivity type to provide fully depleted channel regions and provide normally-off characteristics. According to another preferred embodiment of the present invention, a lateral silicon carbide switching device is provided with a lateral voltage supporting region and a plurality of blocking voltage distributing regions spaced laterally on the voltage supporting region. These blocking voltage distributing regions may comprise floating field plates or, more preferably, argon-implanted amorphous silicon carbide regions.

DESCRIPTION OF PREFERRED EMBODIMENTS

Figure 1:
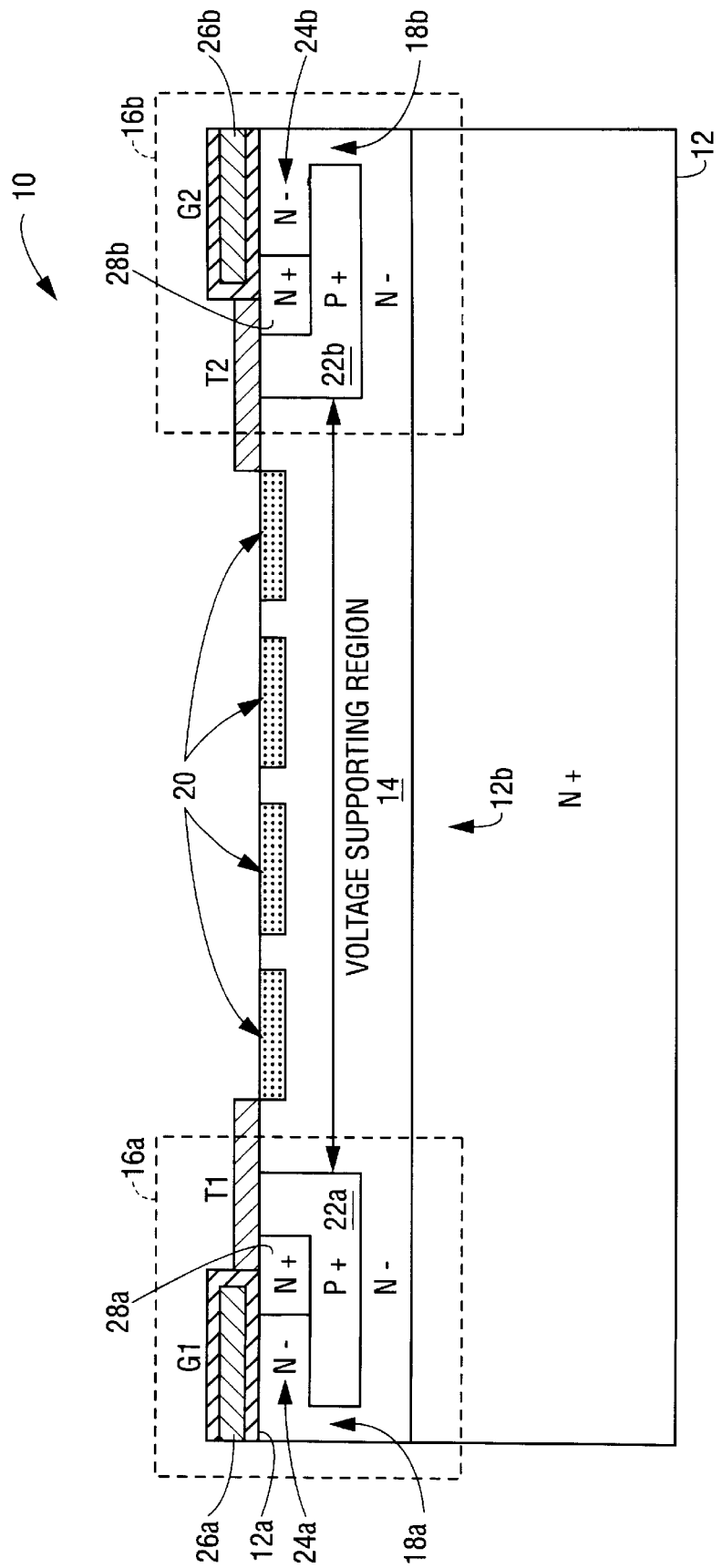
FIG. 1 is a cross-sectional illustration of a semiconductor switching device according to an embodiment of the present invention.

The present invention now will be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawing, the thickness of layers and regions are exaggerated for clarity. Moreover, the terms "first conductivity type" and "second conductivity type" refer to opposite conductivity types such as P or N-type and each embodiment described and illustrated herein includes its complementary embodiment as well. It will also be understood that when a layer is referred to as being "on" another layer or substrate, it can be directly on the other layer or substrate, or intervening layers may also be present.

Referring now to FIG. 1, a unit cell of a preferred semiconductor switching device 10 according to an embodiment of the present invention will be described. This switching device 10 contains a semiconductor substrate 12 of first conductivity type (e.g., N-type) having a face 12a thereon and a blocking voltage supporting region 14 of first conductivity type therein (shown as N−) extending to the face 12a. The blocking voltage supporting region 14 may comprise a relatively lightly doped epitaxial layer having a first conductivity type dopant concentration therein on the order of about $1 \times 10^{16}$ cm$^{-3}$ and may have a thickness of about 2–10 µm. The voltage supporting region 14 is designed to have a much lower majority carrier conductivity than an underlying and highly conductive "bypass" portion 12b of the semiconductor substrate 12. This bypass portion 12b of the substrate (shown as N+), which is capable of supporting large lateral currents with low on-state voltage drop on the order of about 0.25 V, may have a first conductivity type dopant concentration therein on the order of about $1 \times 10^{18}$ cm$^{-3}$ or higher. A composite semiconductor device is also preferably provided at the face of the semiconductor substrate 12, as a lateral current carrying device. Preferably, the composite semiconductor device comprises first and second semiconductor devices 16a and 16b which have respective first and second active regions 18a and 18b of first conductivity type (shown as N−) therein. These active regions 18a and 18b may also be formed from the above-described relatively lightly doped epitaxial layer. These first and second active regions 18a and 18b extend on opposing sides of the voltage supporting region 14 and are electrically coupled by nonrectifying junctions to the bypass portion 12b of the semiconductor substrate 12 which underlies and extends opposite the voltage supporting region 14 relative to the face 12a of the substrate. These first and second semiconductor devices 16a and 16b are preferably configured to provide bidirectional I–V characteristics by facilitating conduction in the first and third quadrants. Simulations on the above described devices confirm that bidirectional current flows primarily via the bypass portion 12b of the substrate 12 and the current flow lines in the bypass portion 12b indicate that the lateral current becomes uniform at a depth of about 20 µm, as measured from the junction with the voltage supporting region 14.

According to one aspect of the present invention, a plurality of spaced electrically insulating regions 20 are formed in the voltage supporting region 14. These plurality of spaced regions 20 extend opposite the bypass portion 12b of the substrate and enhance the blocking voltage capability of the voltage supporting region 14 by distributing the forward and reverse blocking voltages. In a preferred embodiment of the present invention, the plurality of spaced regions 20 of lower conductivity comprise amorphous regions having ions therein which are electrically inactive in the voltage supporting region 14. For a 300 V device using silicon carbide, three (3) regions having widths of about 5 µm may be used in a voltage supporting region 14 having a width of about 20 µm. As determined by the inventors herein, it is not preferable to use only a single amorphous region because of potential reach-through problems. Vertical silicon carbide based devices which utilize amorphous regions are described in U.S. Pat. Nos. 5,449,925 to Baliga et al. entitled "Voltage Breakdown Resistant Monocrystalline Silicon Carbide Semiconductor Devices", and 5,635,412 to Baliga et al. entitled "Methods of Fabricating Voltage Breakdown Resistant Monocrystalline Silicon Carbide Semiconductor Devices", assigned to the present assignee, the disclosures of which are hereby incorporated herein by reference. Vertical and lateral silicon carbide based devices which utilize buried conduction barrier layers are described in U.S. Pat. Nos. 5,543,637 to Baliga entitled "Silicon Carbide Semiconductor Devices Having Buried Silicon Carbide Conduction Barrier Layers Therein", and 5,681,762 to Baliga entitled "Methods of Forming Silicon Carbide Semiconductor Devices Having Buried Silicon Carbide Conduction Barrier Layers Therein", assigned to the present assignee, the disclosures of which are hereby incorporated herein by reference. Silicon Carbide MESFETs which utilize amorphous regions are described in U.S. Pat. Nos. 5,399,883 to Baliga, entitled "High Voltage Silicon Carbide Mesfets and Methods of Fabricating Same", and 5,459,089 to Baliga, entitled "Method of Fabricating High Voltage Silicon Carbide Mesfets", assigned to the present assignee, the disclosures of which are hereby incorporated herein by reference.

Here, the plurality of amorphous regions each have a conductivity that is less than about 0.01 times a conductivity of the voltage supporting region 14 and the voltage supporting region 14 has a conductivity which is less than about 0.01 times a conductivity of the bypass region 12b. Here, the semiconductor material is preferably silicon carbide and the electrically inactive ions preferably include silicon, carbon, argon and/or neon. The first and second semiconductor devices 16a and 16b also preferably comprise silicon carbide accumulation-mode field effect transistors (ACCUFETs) which, in a lateral embodiment, utilize buried regions 22a and 22b of second conductivity type to provide fully depleted channel regions 24a and 24b and provide normally-off characteristics. Bidirectional MOS-gate control is also provided by first and second insulated-gate electrodes 26a and 26b and these electrodes may be independently controllable. Here, among other things, the built-in potential of the P-N junctions formed between the buried regions 22a and 22b and the channel regions 24a and 24b and the spacing between the buried regions and the face 12a influence the degree to which the channel regions 24a and 24b are depleted and also influence the threshold voltages of the ACCUFETs. The construction and operation of semiconductor devices such as ACCUFETs, are more fully described in U.S. Pat. No. 5,323,040 to Baliga, entitled "Silicon Carbide Field Effect Device", the disclosure of which is hereby incorporated herein be reference.

In a preferred embodiment, the buried regions 22a and 22b may have a thickness of about 0.2 µm and the spacing between the laterally extending portions of the buried regions 22a and 22b and the face 12a may be about 0.05 µm.

The gap between opposing buried regions in adjacent unit cells may also be set at about 2.0 μm and the half-width of the insulated-gate electrodes may be about 2.5 μm. Terminals T1 and T2 are also preferably electrically connected to the first and second active regions 18a and 18b by first and second contact regions 28a and 28b. These terminals T1 and T2 may also form Schottky rectifying junctions with the voltage supporting region 14. Other devices, including trench-based transistors such as UMOSFETs and depletion-mode devices, may also be used as the semiconductor devices 16a and 16b. A plurality of devices 16a and 16b may also be provided in a third dimension (not shown) and on opposite sides of a common stripe-shaped voltage supporting region, to provide an integrated switching device having high current carrying capability.

According to another embodiment of the present invention, a lateral silicon carbide switching device is provided with a lateral voltage supporting region 14 and a plurality of blocking voltage distributing regions spaced laterally on the voltage supporting region. These blocking voltage distributing regions may comprise floating field plates and/or floating field rings. The construction and operation of floating field plates and field rings (e.g., P-type field rings) to provide edge termination, are more fully described in Chapter 3 of a textbook by B.J. Baliga entitled "Power Semiconductor Devices", PWS Publishing Co. (1996), the disclosure of which is hereby incorporated herein by reference. More preferably, argonimplanted amorphous silicon carbide regions 20 are to be used as the blocking voltage distributing regions and these regions may be combined with floating field plates and floating field rings to provide additional blocking voltage capability.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A semiconductor switching device, comprising:
   a semiconductor substrate of first conductivity type;
   a voltage supporting region of first conductivity type in said semiconductor substrate, said voltage supporting region having a lower conductivity than said semiconductor substrate;
   first and second semiconductor devices having respective first and second active regions of first conductivity type therein which extend adjacent first and second opposing sides of said voltage supporting region, respectively, and are electrically coupled to a bypass portion of said semiconductor substrate extending opposite said voltage supporting region; and
   a plurality of spaced regions of lower conductivity than said voltage supporting region in said voltage supporting region, said plurality of spaced regions extending opposite the bypass portion of said semiconductor substrate and between the first and second active regions.

2. The switching device of claim 1, wherein said voltage supporting region forms a non-rectifying junction with the bypass portion of said semiconductor substrate.

3. The switching device of claim 1, wherein said plurality of spaced regions of lower conductivity comprise a plurality of amorphous semiconductor regions having ions therein that are electrically inactive in said voltage supporting region.

4. The switching device of claim 2, wherein said plurality of spaced regions of lower conductivity comprise a plurality of amorphous semiconductor regions having ions therein that are electrically inactive in said voltage supporting region.

5. The switching device of claim 3, wherein the ions in said plurality of spaced amorphous semiconductor regions are selected from a group consisting of silicon, carbon, neon and argon.

6. The switching device of claim 4, wherein the ions in said plurality of spaced amorphous semiconductor regions are selected from a group consisting of silicon, carbon, neon and argon.

7. The switching device of claim 6, wherein a conductivity of said plurality of spaced amorphous semiconductor regions is less than a conductivity of said voltage supporting region by a factor of at least about 100; and wherein the conductivity of said voltage supporting region is less than a conductivity of the bypass portion of said semiconductor substrate by a factor of at least about 100.

8. The switching device of claim 1, wherein a conductivity of said plurality of spaced amorphous semiconductor regions is less than a conductivity of said voltage supporting region by a factor of at least about 100; and wherein the conductivity of said voltage supporting region is less than a conductivity of the bypass portion of said semiconductor substrate by a factor of at least about 100.

9. The switching device of claim 5, wherein said semiconductor substrate has a face thereon; wherein said voltage supporting region extends to the face; and wherein said first semiconductor device comprises a first insulated-gate field effect transistor having a first insulated gate electrode on the face, adjacent the first side of said voltage supporting region.

10. The switching device of claim 9, wherein the first insulated-gate field effect transistor comprises:
    a first terminal electrically coupled to the first active region; and
    a first buried region of second conductivity type in said first active region and forming a P-N junction therewith.

11. The switching device of claim 10, wherein the first buried region extends opposite the first insulated gate electrode; wherein the first active region includes a channel region therein which extends between the first buried region and the face; and wherein a spacing between the first buried region and the face is in a range sufficient to fully deplete the channel region when the semiconductor switching device is unbiased.

12. The switching device of claim 11, wherein the first terminal forms a Schottky rectifying junction with said voltage supporting region.

13. The switching device of claim 12, wherein the first buried region has a lateral portion which extends opposite the first insulated gate electrode and a vertical portion which extends to the face and contacts the first terminal.

14. A lateral silicon carbide switching device having bidirectional voltage blocking capability, comprising:
    a silicon carbide substrate containing a silicon carbide bypass region of first conductivity type therein;
    a silicon carbide device layer of first conductivity type on said silicon carbide substrate, said silicon carbide device layer forming a non-rectifying junction with the silicon carbide bypass region and having a voltage supporting region of first conductivity type therein which has a conductivity less than ten times a conductivity of the silicon carbide bypass region;

a silicon carbide semiconductor device having first and second electrodes electrically coupled to said silicon carbide device layer at locations adjacent first and second opposing sides of the voltage supporting region, respectively; and a plurality of blocking voltage distributing regions on the voltage supporting region, between the first and second electrodes of said silicon carbide semiconductor device.

15. The switching device of claim 14, wherein said plurality of blocking voltage distributing regions comprise amorphous silicon carbide regions which form respective junctions with the voltage supporting region and extend opposite the silicon carbide bypass region.

16. The switching device of claim 14, wherein said plurality of blocking voltage distributing regions are selected from the group consisting of floating field plates and floating field rings.

17. The switching device of claim 15, wherein the amorphous silicon carbide regions contain ions therein selected from the group consisting of silicon, carbon, neon and argon.

18. The switching device of claim 17, wherein said silicon carbide device layer has a thickness of about 2.0 $\mu$m; wherein said silicon carbide bypass region has a thickness no less than about 20 $\mu$m; and wherein a conductivity of the voltage supporting region is less than about 0.01 times a conductivity of the silicon carbide bypass region.

19. The switching device of claim 17, wherein said silicon carbide semiconductor device comprises first and second insulated-gate field effect transistors electrically coupled to the first and second electrodes, respectively.

20. The switching device of claim 19, wherein the first and second insulated-gate field effect transistors each comprise accumulation-mode field effect transistors (ACCUFETs).

* * * * *